(12) United States Patent
Lu et al.

(10) Patent No.: US 10,283,471 B1
(45) Date of Patent: May 7, 2019

(54) MICRO-CONNECTION STRUCTURE AND MANUFACTURING METHOD THEREOF

(71) Applicant: Taiwan Semiconductor Manufacturing Co., Ltd., Hsinchu (TW)

(72) Inventors: Wen-Hsiung Lu, Tainan (TW); Chen-Shien Chen, Hsinchu County (TW); Chen-En Yen, Changhua County (TW); Cheng-Jen Lin, Kaohsiung (TW); Chin-Wei Kang, Tainan (TW); Kai-Jun Zhan, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/841,336

(22) Filed: Dec. 14, 2017

Related U.S. Application Data

(60) Provisional application No. 62/581,788, filed on Nov. 6, 2017.

(51) Int. Cl.
*H01L 23/52* (2006.01)
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/02255* (2013.01); *H01L 2224/0345* (2013.01); *H01L 2224/03464* (2013.01); *H01L 2224/03614* (2013.01); *H01L 2224/03622* (2013.01); *H01L 2224/0401* (2013.01); *H01L 2224/05147* (2013.01); *H01L 2224/05559* (2013.01); *H01L 2224/05564* (2013.01); *H01L 2224/05583* (2013.01); *H01L 2224/05624* (2013.01); *H01L 2224/05644* (2013.01); *H01L 2224/05666* (2013.01); *H01L 2224/05671* (2013.01); *H01L 2224/05681* (2013.01); *H01L 2224/05684* (2013.01); *H01L 2224/11464* (2013.01); *H01L 2224/13007* (2013.01); *H01L 2224/13014* (2013.01); *H01L 2224/13026* (2013.01); *H01L 2224/13144* (2013.01)

(58) Field of Classification Search
CPC ......... H01L 24/05; H01L 24/03; H01L 24/11; H01L 24/13
USPC ........................................... 257/737; 438/613
See application file for complete search history.

(56) References Cited

U.S. PATENT DOCUMENTS

| | | | | |
|---|---|---|---|---|
| 7,728,431 B2 * | 6/2010 | Harada | .................. | H01L 24/03 257/750 |
| 7,750,469 B2 * | 7/2010 | Cho | ..................... | H01L 23/3171 257/738 |
| 7,825,513 B2 * | 11/2010 | Osumi | ................ | H01L 23/3171 257/737 |

(Continued)

*Primary Examiner* — Luan C Thai
(74) *Attorney, Agent, or Firm* — JCIPRNET

(57) ABSTRACT

A micro-connection structure is provided. The micro-connection structure includes an under bump metallurgy (UBM) pad, a bump and an insulating ring. The UBM pad is electrically connected to at least one metallic contact of a substrate. The bump is disposed on the UBM pad and electrically connected with the UBM pad. The insulating ring surrounds the bump and the UBM pad. The bump is separate from the insulating ring with a distance and the bump is isolated by a gap between the insulating ring and the bump.

20 Claims, 19 Drawing Sheets

(56) References Cited

U.S. PATENT DOCUMENTS 9,054,081 B2 * 6/2015 Nakamura ............. H01L 24/13
9,349,700 B2 * 5/2016 Hsieh ..................... H01L 24/13

* cited by examiner

MICRO-CONNECTION STRUCTURE AND MANUFACTURING METHOD THEREOF

CROSS-REFERENCE TO RELATED APPLICATION

This application claims the priority benefit of U.S. provisional application Ser. No. 62/581,788, filed on Nov. 6, 2017. The entirety of the above-mentioned patent application is hereby incorporated by reference herein and made a part of this specification.

BACKGROUND

Micro-bump technologies are able to provide a higher input/output density within the smaller form factor packages with acceptable electrical performance. Even though the development of fine-pitch micro-bump packages faces quite a few challenges, further solutions are proposed to enhance the bonding strength and the reliability of the micro-connections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
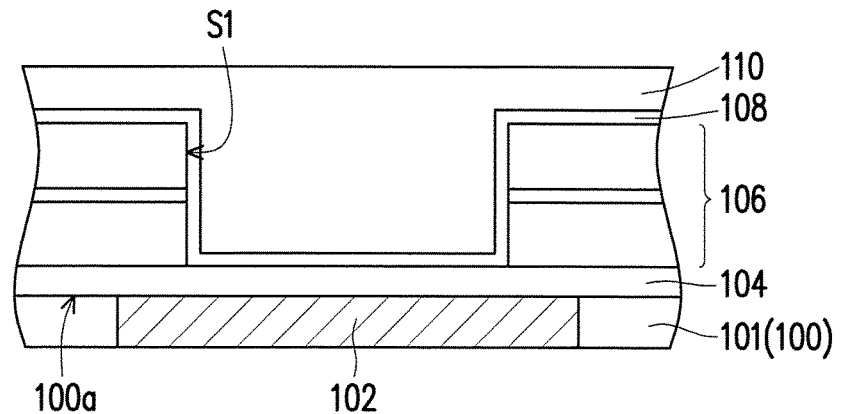
FIG. 1A to FIG. 1J' are schematic cross-sectional views showing a portion of an exemplary package at various stages of the manufacturing method for forming at least one micro-connection structure in the package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of semiconductor packages and the packages fabricated there-from. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure. The embodiments are intended to provide further explanations but are not used to limit the scope of the present disclosure.

FIG. 1A to FIG. 1J illustrates schematic cross-sectional views showing a portion of an exemplary package at various stages of the manufacturing method for forming at least one micro-connection structure in the package according to some embodiments of the present disclosure. Referring to FIG. 1A, in certain embodiments, a substrate 100 having at least one metallic contact 102 therein is provided. In some embodiments, the substrate 100 is a monocrystalline semiconductor substrate, such as a bulk silicon substrate or a silicon wafer. In some embodiments, the substrate 100 may be a silicon-on-insulator (SOI) substrate or a GOI (germanium-on-insulator) substrate as alternatives. In certain embodiments, the substrate 100 includes a chip or a die and may be part of a wafer or a reconstructed wafer. Also, in accordance with the embodiments, the substrate 100 may include other conductive layers, doped regions or active devices (such as transistors, diodes or the like) or other semiconductor elements. In some embodiments, the substrate 100 includes at least one semiconductor chip (or die) 101 having a plurality of contact pads and the metallic contact 102 is one of the contact pads of the semiconductor chip 101. Although the substrate 100 has more than one metallic contacts 102, only one exemplary metallic contact is shown herein. In some embodiments, the material of the metallic contact 102 includes copper or copper alloys, for example.

As shown in FIG. 1A, a protection layer 104 is formed on the active surface 100a of the substrate 100, and a patterned insulating layer 106 is formed on the protection layer 104. In some embodiments, the protection layer 104 includes a silicon nitride layer. In alternative embodiments, the protection layer 104 is optionally formed and may be skipped. In some embodiments, the formation of the patterned insulating layer 106 includes forming an insulating material layer (not shown) on the protection layer 104 and then patterning the insulating material layer to form openings S1 exposing the underlying protection layer 104. In some embodiments, the material of the patterned insulating layer 106 includes silicon oxide, silicon nitride, silicon oxynitride and/or the combinations thereof. In some embodiments, the insulating material layer includes a stack of a silicon nitride layer sandwiched between two silicon oxide layers. In some embodiments, the protection layer 104 and the insulating material layer may be formed by chemical vapor deposition (CVD). In one embodiment, the patterned insulating layer 106 may be patterned into ring patterns that partially cover and surround the metallic contacts 102, with central openings S1 exposing the protection layer 104 on the metallic contacts 102. That is, the patterned insulating layer 106 may be considered as a plurality of insulating rings. In some embodiments, a barrier layer 108 is formed on the patterned insulating layer 106 and the barrier layer 108 is conformal to the profile of the opening S1 of the patterned insulating layer 106. In some embodiments, the location of the opening S1 may correspond to the location of the metallic contact 102. In one embodiment, the opening S1 is smaller in size than the metallic contact 102. The barrier layer 108 covers the protection layer 104 exposed by the openings S1 of the patterned insulating layer 106. Later, a filling layer 110 is formed over the barrier layer 108 and the patterned insulating layer 106, filling up the openings S1. In some embodiments, the material of the barrier layer 108 includes metal oxide formed by physical vapor deposition (PVD) or CVD. In one embodiments, the barrier layer 108 includes an aluminum oxide layer, for example. The barrier layer 108 is more resistant to the following etching process. In one embodiment, the barrier layer 108 functions to prevent the subsequent formed bump being contaminated due to diffusion of impurities from the underlying layer(s). In some embodiments, the filling layer 110 may include one or more materials selected from tetraethyl orthosilicate (TEOS), silicon oxide, silicate glass and low dielectric constant materials. The method of forming the filling layer 110 includes CVD, high aspect ratio process (HARP) or spin coating, for example.

Figure 1B:
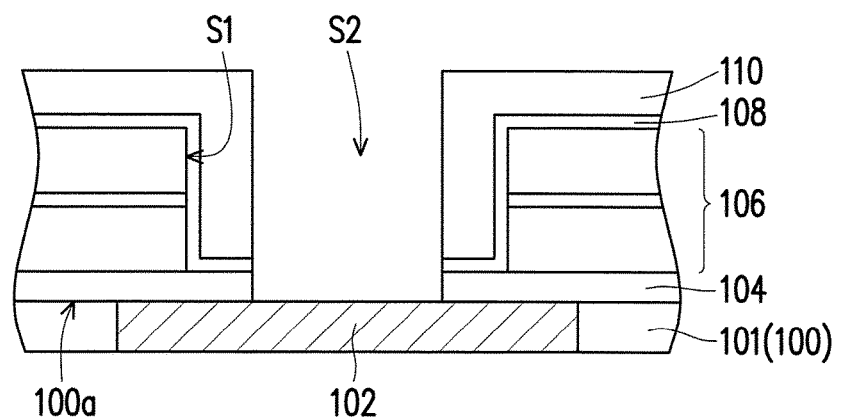

In some embodiments, in FIG. 1B, a patterning process is performed to form a plurality of openings S2 exposing the underlying metallic contact 102. In certain embodiments, the patterning process is performed by forming a photoresist pattern (not shown) on the filling layer 110 and performing an etching process to partially remove the filling layer 110, the barrier layer 108 and the protection layer 104. In some embodiments, the location of the opening S2 may correspond to the location of the metallic contact 102. In some embodiments, the size of the opening S2 is smaller than the size of the opening S1, and the opening S2 is located within the opening S1. In one embodiment, the opening S2 exposes a central portion of the metallic contact 102, and the patterned insulating layer 106 is covered by the barrier layer 108 but not exposed by the openings S2. In certain embodiments, the shape of the opening S2 may be round, oval, rectangular or any polygonal shape. In one embodiment, the opening S2 is in a round shape and the subsequently formed bump may be in an approximately round shape.

Figure 1C:
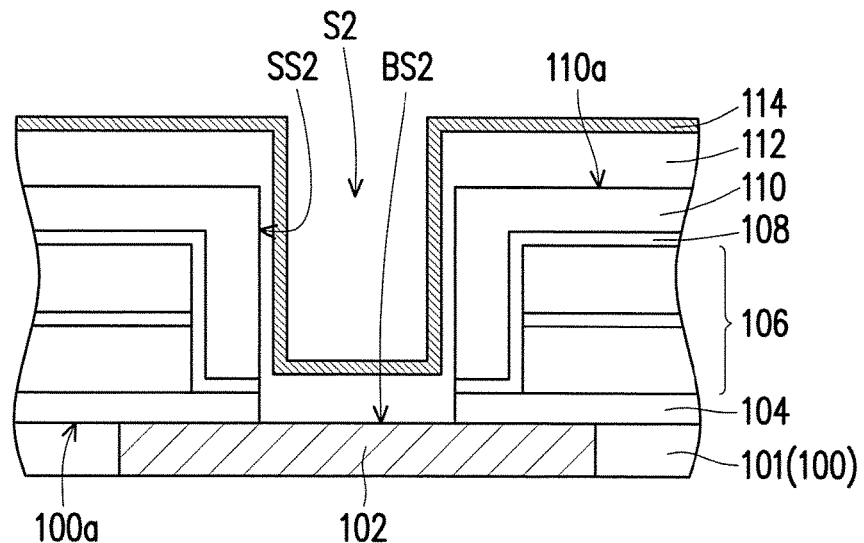

In FIG. 1C, a bonding enhancement layer 112 and a seed layer 114 are formed sequentially on the patterned filling layer 110 and on the exposed metallic contact 102. In some embodiments, the bonding enhancement layer 112 is formed over the patterned filling layer 110 covering the top surface 110a of the patterned filling layer 110 and covering the bottom BS2 of the opening S2 (i.e. covering the exposed metallic contact 102) and the sidewall(s) SS2 of the opening S2 (i.e. covering the exposed sides of the patterned filling layer 110, the barrier layer 108 and the protection layer 104). That is, the bonding enhancement layer 112 is located directly on and in direct contact with the metallic contact 102. In certain embodiments, depending on the aspect ratio, the bonding enhancement layer 112 formed on the metallic contact 102 and on the top surface 110a may be thicker than the bonding enhancement layer 112 formed on the sidewalls SS2. Later, the seed layer 114 is conformally formed on the bonding enhancement layer 112. In some embodiments, the material of the bonding enhancement layer 112 includes titanium, tungsten, chromium, a titanium-tungsten alloy, a titanium-tungsten-copper alloy, a titanium-copper alloy or combinations thereof. In one embodiment, the bonding enhancement layer 112 includes a titanium-tungsten (TiW) layer. In one embodiment, the bonding enhancement layer 112 may be formed with a thickness of about 2500~4000 angstroms or about 3000~3200 angstroms by sputtering or physical vapor deposition (PVD). In some embodiments, the seed layer 114 includes a gold layer formed by sputtering or PVD. In one embodiment, the seed layer 114 is formed with a thickness of about 700~900 angstroms or 800 angstroms.

Figure 1D:
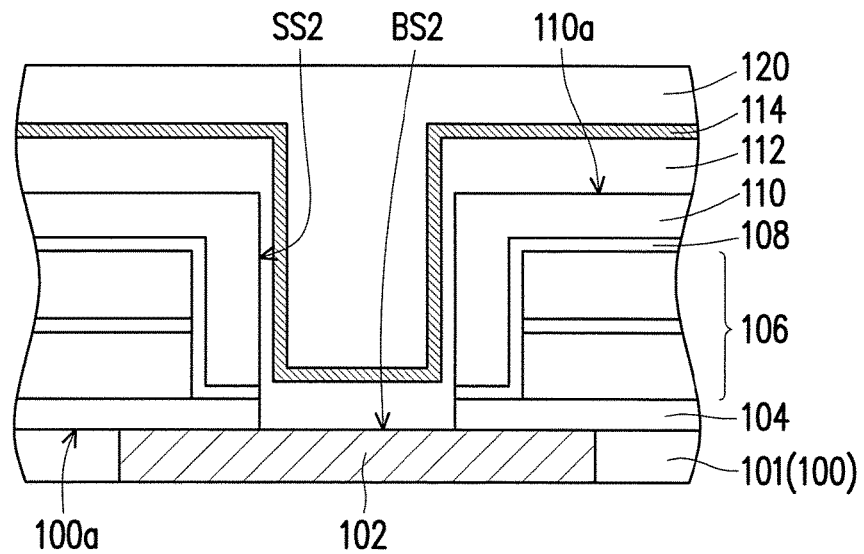

Referring to FIG. 1D, a masking layer 120 is formed over the substrate 100 and on the seed layer 114, filling up the opening S2. In some embodiments, the masking layer 120 is a photoresist layer.

Figure 1E:
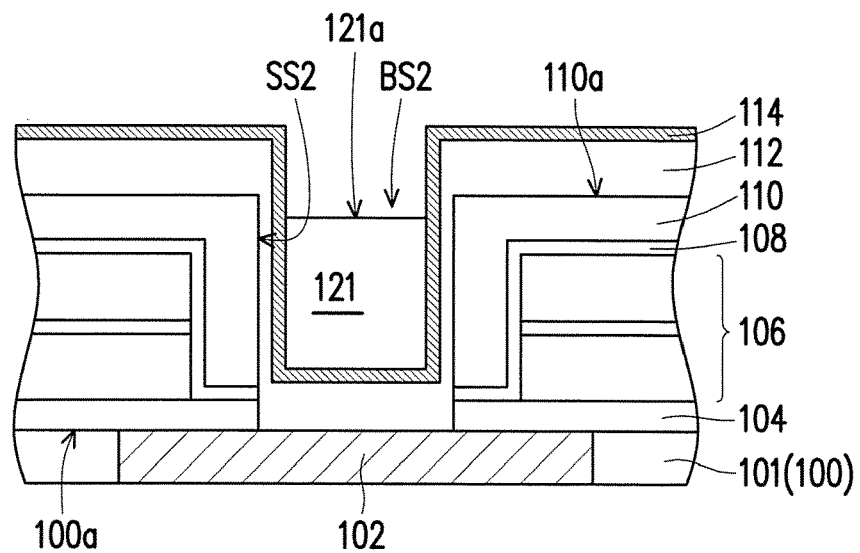

Referring to FIG. 1E, an etching back process is performed to remove the masking layer 120 outside the opening S2 and above the patterned filling layer 110 so that a masking pattern 121 is remained within the opening S2 with a top surface 121a lower than the top surface 110a of the patterned filling layer 110. In some embodiments, the etching back process includes an anisotropic etching process.

Figure 1F:
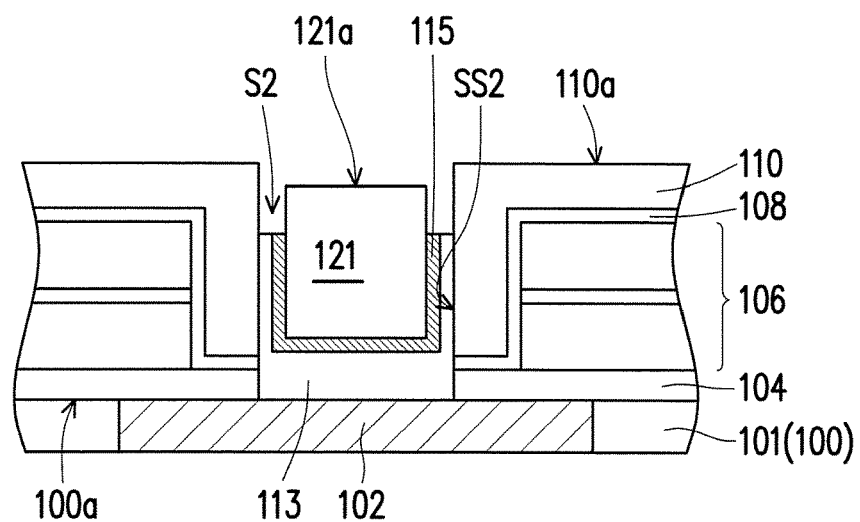

In some embodiments, in FIG. 1F, using the masking pattern 121 as an etching mask, the bonding enhancement layer 112 and the seed layer 114 are removed until the top surface 110a of the patterned filling layer 110 is exposed. In some embodiments, the bonding enhancement layer 112 and the seed layer 114 outside the opening S2 and above the patterned filling layer 110 are removed to form the bonding enhancement pattern 113 and the seed pattern 115 respectively (i.e. the bonding enhancement layer 112 and the seed layer 114 remained in the opening S2 and surrounding the masking pattern 121). In certain embodiments, the tops of the bonding enhancement pattern 113 and the seed pattern 115 are lower than the top surface 121a of the masking pattern 121. In one embodiment, the tops of the bonding enhancement pattern 113 and the seed pattern 115 are lower than the barrier layer 108 located on the top surface 106a of the patterned insulating layer 106. In one embodiment, the bonding enhancement layer 112 and the seed layer 114 are removed by performing at least a wet etching process.

Figure 1G:
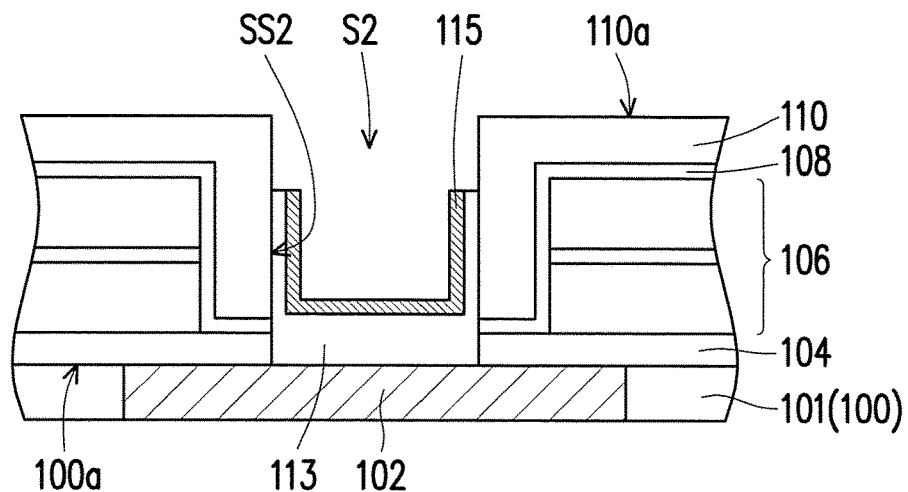

Referring to FIG. 1G, the masking pattern 121 (see FIG. 1F) is removed and the bonding enhancement pattern 113 and the seed pattern 115 located within the opening S2 are exposed. In some embodiments, the masking pattern 121 is removed by performing the photoresist stripping process.

Figure 1H:
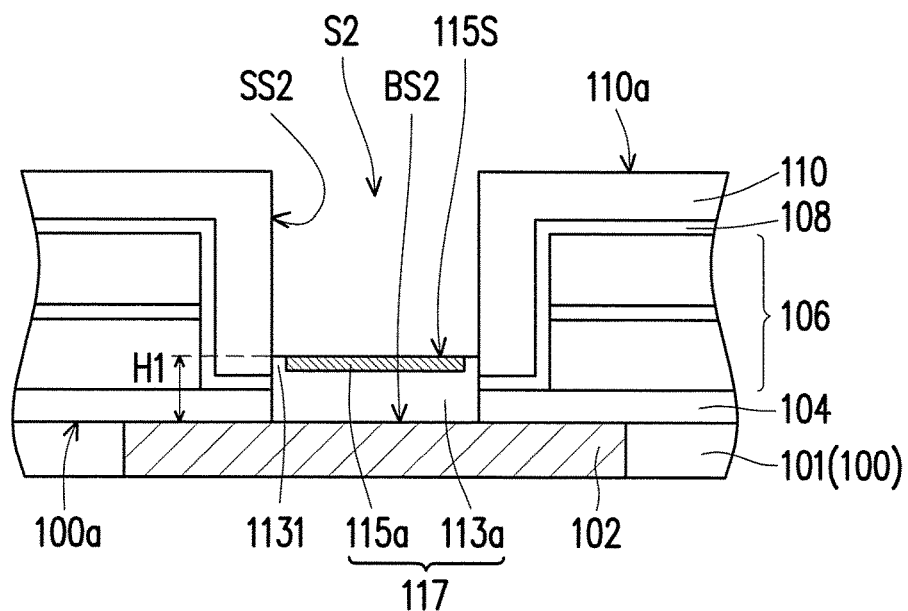

Referring to FIG. 1H, portions of the bonding enhancement pattern 113 and the seed pattern 115 located on the sidewalls SS2 of the opening S2 are removed. In one embodiment, the bonding enhancement pattern 113 and the seed pattern 115 located on the sidewalls SS2 are both removed, and the remained seed pattern 115a is surrounded by the remained bonding enhancement pattern 113a but the remained seed pattern 115a is not in contact with the sidewalls SS2. That is, the remained seed pattern 115a is inlaid in the remained bonding enhancement pattern 113a and is surrounded by a ring-shaped ridge portion 1131 of the remained bonding enhancement pattern 113a. In some embodiments, the removal of the bonding enhancement pattern 113 and the seed pattern 115 located on the sidewalls SS2 of the opening S2 includes performing a wet etching process or a lateral etching process, which especially removes the bonding enhancement pattern 113 and the seed pattern 115 on the vertical side surfaces SS2, instead of those on the horizontal surfaces (i.e. surfaces parallel to the active surface 100a). In one embodiment, the wet etching process includes a first wet etching process for gold and a second wet etching process for titanium-tungsten. In certain cases, in the presence of another metal (such as Ti or TiW), a vertical or reentrant profile with much greater undercut is often observed during wet etching a gold film with an underlying adhesion layer of another metal. In one embodiment, the bonding enhancement pattern 113 and the seed pattern 115 located on the sidewalls SS2 are removed until the remained seed pattern 115a is leveled with the remained bonding enhancement pattern 113a. That is, the top surface 115S of the remained seed pattern 115a is horizontally flush with the top surface of the ridge portion 1131. In one embodiment, the top surface 115S of the remained seed pattern 115a is higher than the barrier layer 108 located on the protection layer 104. In some embodiments, the remained bonding enhancement pattern 113a and the remained seed pattern 115a located on the bottom BS2 of the opening S2 may function as an under bump metallurgy (UBM) pad 117. In some embodiments, the stack of the remained bonding enhancement pattern 113a and the remained seed pattern 115a (the UBM pad 117) has a height H1. In some embodiments, the height H1 ranges from about 500 angstroms to about 3000 angstroms.

Figure 1I:
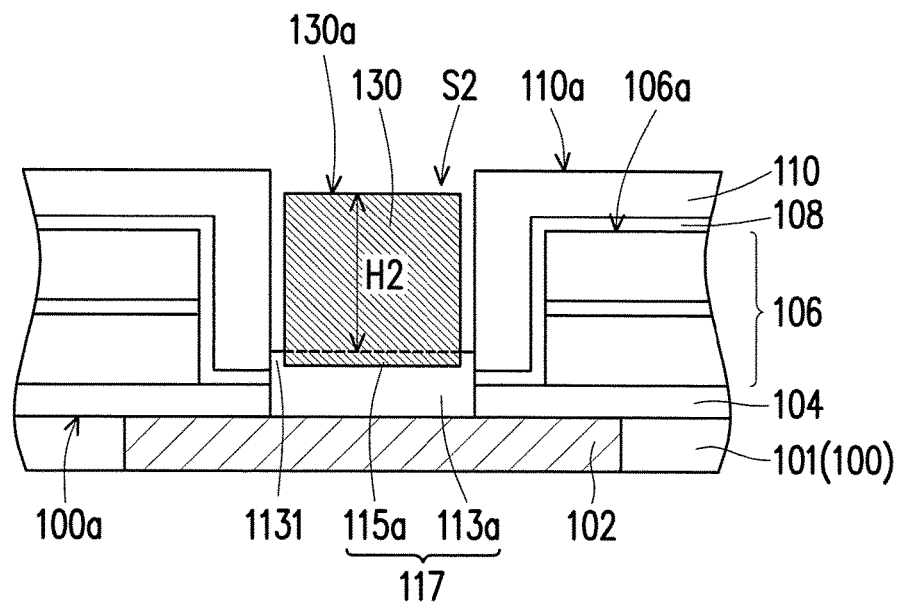

As shown in FIG. 1I, a plurality of bumps 130 (only one is shown) is formed on the remained seed pattern 115a and the remained bonding enhancement pattern 113a within the opening S2. In some embodiments, the material of the bump includes gold formed by electroless plating. In certain embodiments, the bumps 130 are directly formed on the remained seed pattern 115a using the gold pattern as the seed layer during electroless plating. In one embodiment, the bump 130 is a gold bump or gold stud bump. In one embodiment, the bump 130 has a top surface 130a lower than the top surface 110a of the patterned filling layer 110, but higher than the barrier layer 108 located on the top surface 106a of the patterned insulating layer 106. In some embodiments, the bumps 130 have a height H2. In some embodiments, the bump 130 sits on the remained seed pattern 115a with the ridge portion 1131 surrounding the bump 130. If considering the bump 130 being a round bump, the diameter (size) of the bump 130 may be equivalent to or less than 3.5 microns or may range from about 1.5 microns to about 3.5 microns.

In some embodiments, as the bonding enhancement layer 112 and the seed layer 114 are removed before the formation of the bumps 130, the subsequently formed bumps 130 can provide a pure metal joint surface for further bonding and will not be affected or polluted by possible particles or residues resulted from UBM etching.

Figure 1J:
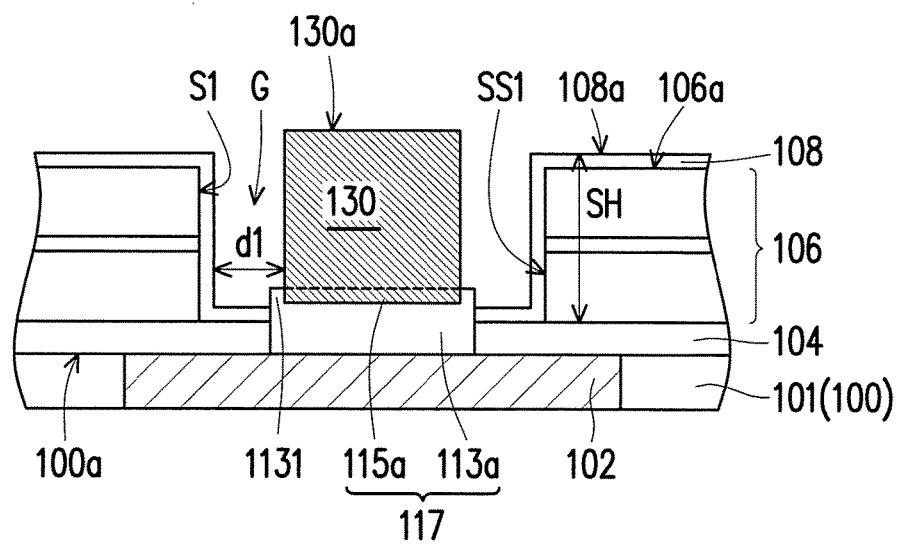

Referring to FIG. 1J, the patterned filling layer 110 is removed and the barrier layer 108 is exposed. In certain embodiments, the exposed barrier layer 108 located on the patterned insulating layer 106 covers the top surface 106a and sidewalls SS1 (i.e. the sidewalls SS1 of the opening S1) of the patterned insulating layer 106 as well as the protection layer 104 exposed by the openings S1 of the patterned insulating layer 106. Due to the existence of the patterned insulating layer 106, the barrier layer 108 has a step height difference SH. In some embodiments, the top surface 130a of the bump 130 is higher than the top surface 108a of the barrier layer 108 located on the top surface 106a of the patterned insulating layer 106. In one embodiment, as shown in FIG. 1J, the barrier layer 108 located on the protection layer 104 is in direct contact with the remained bonding enhancement pattern 113a but is not in contact with the bump 130 or the remained seed pattern 115a.

Figure 1K:
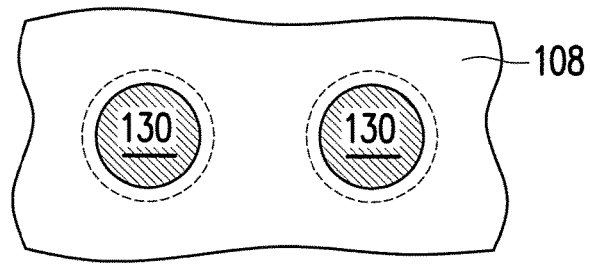
FIG. 1K and FIG. 1K' are schematic top views showing a portion of an exemplary package similar to the structures shown in FIG. 1J and FIG. 1J' respectively.
Figure 1H:
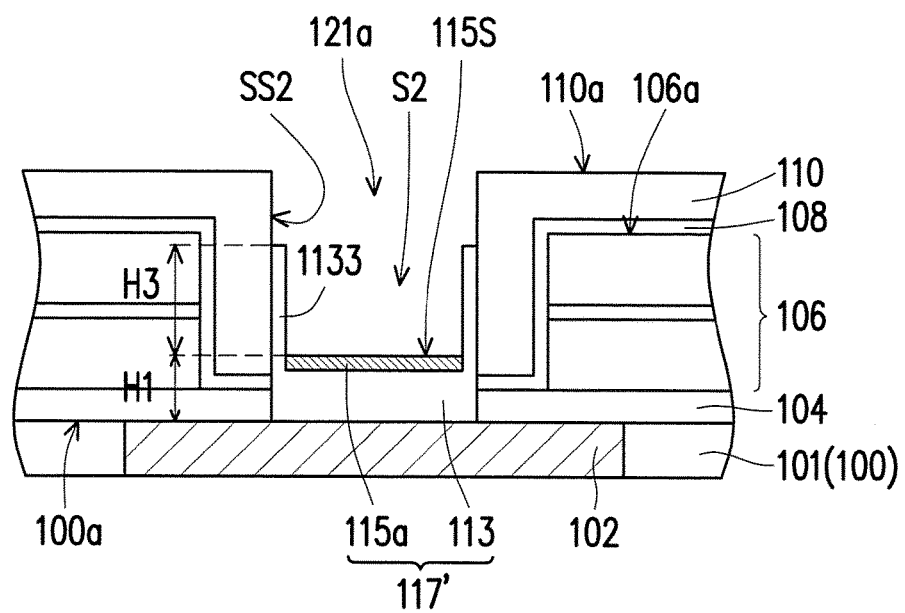
Figure 1I:
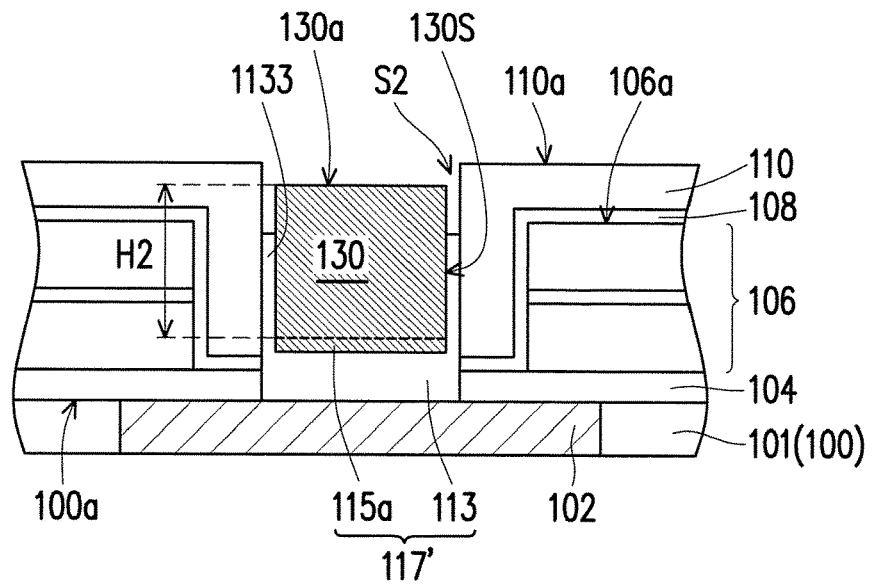
Figure 1J:
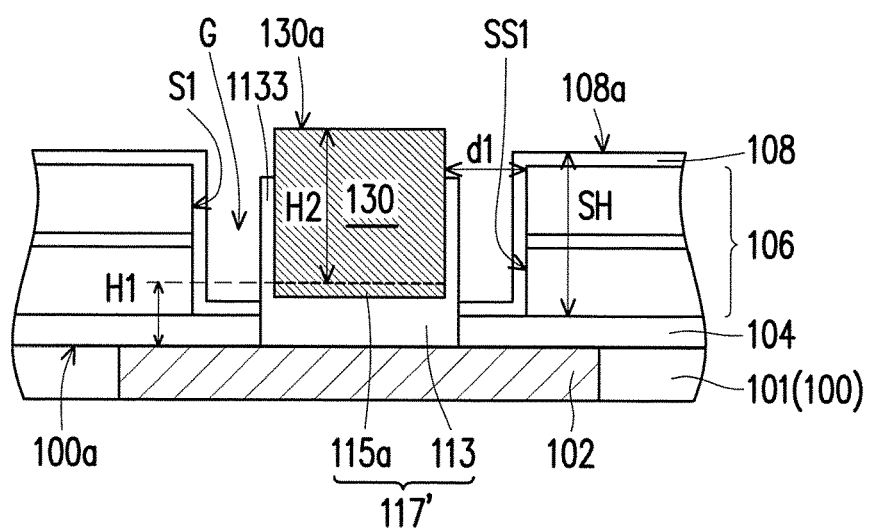
Figure 1K:
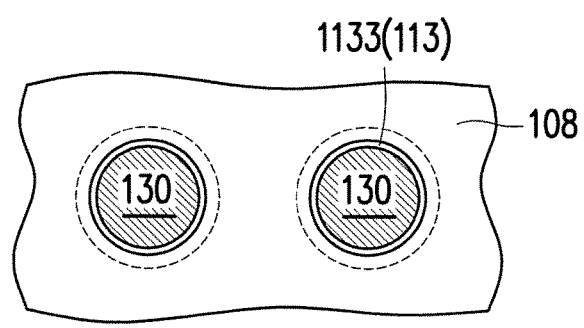

As seen in FIGS. 1J and 1K, there is a gap (empty space) G between the bump 130 and the barrier layer 108 located on the sidewalls SS1. In certain embodiments, the gap G provides room for accommodating extra bonding material during the bonding of the gold bump with external connections, thus avoiding shorts and improving the connection reliability. In some embodiments, the bump 130 is surrounded by the barrier layer 108 but is not in contact with the barrier layer 108. That is, the bump 130 is isolated and separated by the ring-shaped gap G surrounding the bump 130 and the bump 130 is separated from the barrier layer 108 on the sidewall SS1 with a distance dl. From the top view of FIG. 1K, the span of the gap G is shown by the dotted line, and the bumps 130 are surrounded by the barrier layer 108. In FIG. 1K, two bumps 130 are shown, but it is understood that the number of the bumps is not limited by the embodiments herein. In some embodiments, the total height (H1+H2) of the bump 130 and the UBM pad 117 (the stack of the remained bonding enhancement pattern 113a and the remained seed pattern 115a) is larger (higher) than the step height SH. In some embodiments, the total height (H1+H2) of the bump 130 and the UBM pad 117 is larger than the sum of the thickness of the protection layer 104 and the step height SH. That is, the bump 130 located on the UBM pad 117 protrudes out of the opening S1 and is higher than the barrier layer 108. In some embodiments, the total height (H1+H2) of the bump 130 and the UBM pad 117 ranges from about 0.5 microns to about 1.4 microns. In some embodiments, the size dl (i.e. the largest distance between the bump sidewall and the barrier layer 108 located on the sidewall SS1 of the opening S1) of the gap G ranges from 0.2 microns to about 1.5 microns.

FIG. 1H', FIG. 1I' and FIG. 1J' are schematic cross-sectional views showing a portion of an exemplary package at various stages of the manufacturing method for forming at least one micro-connection structure in the package according to alternative embodiments of the present disclosure. In alternative embodiments, referring to FIG. 1H', following the processes as described in FIG. 1A to FIG. 1G, sidewall/vertical portion of the seed pattern 115 (the seed pattern 115 located on the sidewalls SS2 of the opening S2) is removed while the sidewall portion 1133 of the bonding enhancement pattern 113 (the bonding enhancement pattern 113 located directly on the sidewalls SS2 of the opening S2) is not removed. In one embodiment, the remained seed pattern 115a located within the bonding enhancement pattern 113 is not in contact with the sidewalls SS2. That is, the remained seed pattern 115a is disposed on the bonding enhancement pattern 113 and is surrounded by the ring-shaped sidewall portion 1133 of the bonding enhancement pattern 113. In some embodiments, the removal of the seed pattern 115 located on the sidewalls SS2 of the opening S2 includes performing a wet etching process or a lateral etching process, which especially removes the seed pattern 115 on the vertical side surfaces SS2, instead of those on the horizontal surfaces (i.e. surfaces parallel to the active surface 100a). In one embodiment, the top of the sidewall portion 1133 of the bonding enhancement pattern 113 is lower than the barrier layer 108 located on the top surface 106a of the patterned insulating layer 106. In some embodiments, the top surface 115S of the remained seed pattern 115a is higher than the barrier layer 108 located on the protection layer 104. In some embodiments, the bonding enhancement pattern 113 and the remained seed pattern 115a may function as an under bump metallurgy (UBM) pad 117'. Compared with the UBM pad 117 depicted in FIG. 1H, the UBM pad 117' in FIG. 1H' has extra (unremoved) sidewall portion 1133. In some embodiments, the sidewall portion 1133 has a height H3 and the remained seed pattern 115a and the bottom portion of the bonding enhancement pattern 113 has a height H1.

As shown in FIG. 1I', a plurality of bumps 130 (only one is shown) is formed on the remained seed pattern 115a, within the bonding enhancement pattern 113 and within the opening S2. In some embodiments, the material of the bump 130 includes gold formed by electroless plating. In one embodiment, the bump 130 is a gold bump or gold stud bump. In one embodiment, the bump 130 has a top surface 130a lower than the top surface 110a of the patterned filling layer 110. In some embodiments, the bumps 130 have a height H2, and the height H3 of the sidewall portion 1133 is at least larger than 1/10 of the total height (H1+H2) of the bump 130 and the UBM pad 117' and smaller than 1/2 of the total height (H1+H2) of the bump 130 and the UBM pad 117'. In some embodiments, the bump 130 sits on the remained seed pattern 115a with the sidewall portion 1133 surrounding the bump 130. In one embodiment, the unremoved sidewall portion 1133 covers a lower portion of the sidewall 130S of the bump 130.

Referring to FIG. 1J', the patterned filling layer 110 is removed and the barrier layer 108 is exposed. In certain embodiments, the exposed barrier layer 108 located on the patterned insulating layer 106 covers the top surface 106a and sidewalls SS1 (i.e. the sidewalls SS1 of the opening S1) of the patterned insulating layer 106 as well as the protection layer 104 exposed by the openings S1 of the patterned insulating layer 106. In some embodiments, the top surface 130a of the bump 130 is higher than the top surface 108a of the barrier layer 108 located on the top surface 106a of the patterned insulating layer 106. In one embodiment, as shown in FIG. 1J', the bump 130 or the remained seed pattern 115a is not in contact with the barrier layer 108.

As seen in FIGS. 1J' and 1K', there is a gap (empty space) G between the barrier layer 108 located on the sidewalls SS1 and the bump 130 and the sidewall portion 1133. In certain embodiments, the gap G helps improving the connection reliability. In some embodiments, the bump 130 is surrounded by the barrier layer 108 but is not in contact with the barrier layer 108. That is, the bump 130 is isolated by the gap G and the sidewall portion 1133, and the bump 130 is separated from the barrier layer 108 by a distance d1 (i.e. the largest distance). From the top view of FIG. 1K', the bumps 130 are surrounded by the sidewall portion 1133 of the bonding enhancement pattern 113 and are surrounded by the barrier layer 108, while the spans of the gaps G are shown by the dotted lines. In some embodiments, the total height (H1+H2) of the bump 130 and the UBM pad 117' is larger than the step height SH. In some embodiments, the total height (H1+H2) of the bump 130 and the UBM pad 117 is larger than the sum of the thickness of the protection layer 104 and the step height SH. In some embodiments, the size d1 (the largest distance between the bump sidewall and the barrier layer 108 located on the sidewall SS1 of the opening S1) of the ring-shaped gap G ranges from 0.2 microns to about 1.5 microns.

Figure 4A:
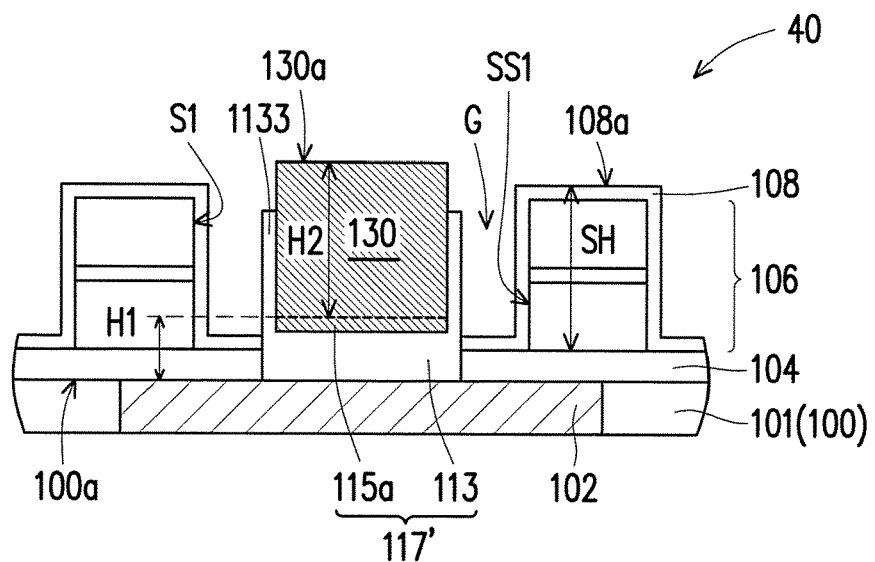
FIG. 4A is a schematic cross-sectional view of an exemplary micro-connection structure of a package in accordance with some embodiments of the present disclosure.
Figure 4B:
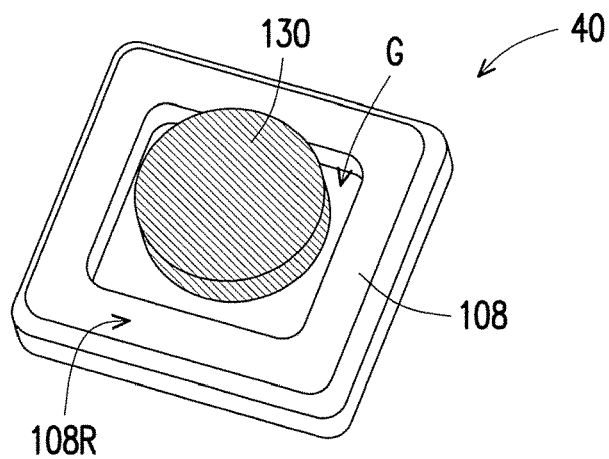
FIG. 4B is a schematic three-dimensional view of an exemplary micro-connection structure of a package in accordance with embodiments of the present disclosure.

FIG. 4A is a schematic cross-sectional view of an exemplary micro-connection structure of a package in accordance with some embodiments of the present disclosure. FIG. 4B is a schematic three-dimensional view of an exemplary micro-connection structure of a package in accordance with embodiments of the present disclosure. As shown in FIG. 4A, in certain embodiments, the micron-connection structure 40 includes the UBM pad 117', the bump 130, the patterned insulating layer 106 and the barrier layer 108. In some embodiments, the bump 130 and the UBM pad 117' are located on the metallic contact 102 and electrically connected with the metallic contact 102. In some embodiments, the bump 130 located on the UBM pad 117' protrudes out of the opening S1 and the bump 130 is higher than the barrier layer 108 located on the patterned insulating layer 106. In some embodiments, the bump 130 sits on the remained seed pattern 115a with the sidewall portion 1133 surrounding the bump 130. In some embodiments, the bump 130 is surrounded and partially shielded by the sidewall portion 1133 and the sidewall portion 1133 partially covers the sidewall 130S of the bump 130. In some embodiments, in FIG. 4A and FIG. 4B, the patterned insulating layer 106 may be patterned as rectangular ring-shaped pattern or rectangular ring(s) and the barrier layer 108 covering the rectangular ring-shaped patterned insulating layer 106 is shown as a protruded rectangular ring(s). Herein, the insulating ring or the ring-shaped patterns may be round, oval, rectangular or any suitable polygonal rings. In FIG. 4B, the ring-shaped gap G surrounding the bump 130 isolates the bump 130 from the protruded rectangular ring 108R (the barrier layer 108 covering the rectangular ring-shaped patterned insulating layer 106). In FIG. 4A, the barrier layer 108 is not in physical contact with the bump 130, but the barrier layer 108 touches the UBM pad 117'. In some embodiments, the bump 130 has a height H2, and the total height (H1+H2) of the bump 130 and the UBM pad 117' ranges from about 0.5 microns to about 1.4 microns. In some embodiments, the height H3 of the sidewall portion 1133 is at least larger than 1/10 of the total height (H1+H2) of the bump 130 and the UBM pad 117' and smaller than 1/2 of the total height (H1+H2) of the bump 130 and the UBM pad 117'.

FIG. 2A to FIG. 2H are schematic cross-sectional views showing a portion of an exemplary package at various stages of the manufacturing method for forming at least one micro-connection structure in the package according to some embodiments of the present disclosure. The similar or substantially the same elements as described in FIG. 1A-FIG. 1K' may be labelled with the same reference. The technology, process details, conditions or the materials used in the similar or substantially the same manufacturing process will not be repeated or described in details in the following paragraphs.

Figure 2A:
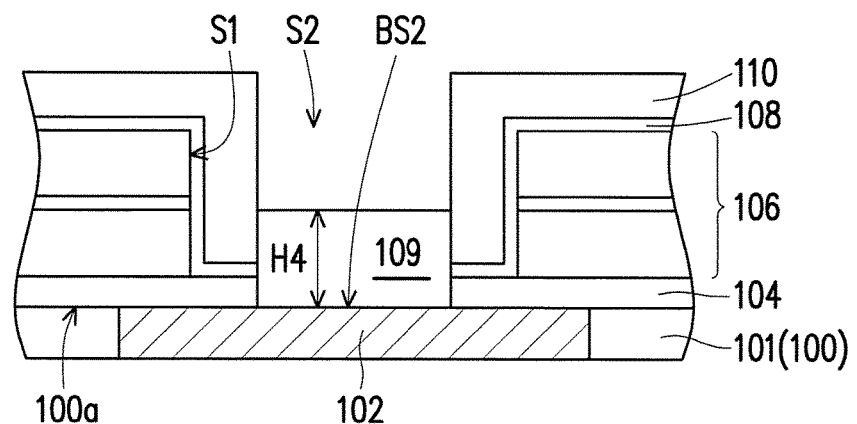
FIG. 2A to FIG. 2H are schematic cross-sectional views showing a portion of an exemplary package at various stages of the manufacturing method for forming at least one micro-connection structure in the package according to some embodiments of the present disclosure.

Referring to FIG. 2A, in certain embodiments, the substrate 100 includes plural semiconductor chip or die 101 having more than one metallic contact 102 is one of the contact pads of the semiconductor chip 101. In some embodiments, the material of the metallic contact 102 includes copper or copper alloys, for example. In some embodiments, an optional protection layer 104 is formed on the active surface 100a of the substrate 100, and a patterned insulating layer 106 is formed on the protection layer 104. In some embodiments, there are openings S1 (one is shown)

in the patterned insulating layer 106 exposing the protection layer 104. In one embodiment, the patterned insulating layer 106 may be patterned into ring patterns that partially cover and surround the metallic contacts 102, with central openings S1 exposing the protection layer 104 on the metallic contacts 102. That is, the patterned insulating layer 106 may be considered as a plurality of insulating rings. Following the formation of a conformal barrier layer 108 and the formation of the filling layer 110, more than one opening S2 (one is shown) are formed exposing the metallic contact(s) 102. In some embodiments, the location of the opening S2 corresponds to the location of the metallic contact 102, and the opening S2 exposes a central portion of the metallic contact 102. Later, a metallic pad 109 is formed on the bottom BS2 of the opening S2 and is formed within the opening S2. In one embodiment, the metallic pad 109 has a height H4. In some embodiments, the material of the metallic pad 108 includes copper. In some embodiments, the metallic pad 108 is a copper pad formed by electroless plating, and the copper pad includes little impurity (e.g. less than or at most 100~1000 ppm phosphorus (P) impurity).

In some embodiments, the material of the patterned insulating layer 106 includes silicon oxide, silicon nitride, silicon oxynitride and/or the combinations thereof. In one embodiments, the barrier layer 108 includes an aluminum oxide layer, for example. The barrier layer 108 is more resistant to the following etching process. In one embodiment, the barrier layer 108 functions to prevent the subsequent formed bump being contaminated due to diffusion of impurities from the underlying layer(s). In some embodiments, the filling layer 110 may include one or more materials selected from tetraethyl orthosilicate (TEOS), silicon oxide, silicate glass and low dielectric constant materials. The method of forming the filling layer 110 includes CVD, high aspect ratio process (HARP) or spin coating, for example.

Figure 2B:
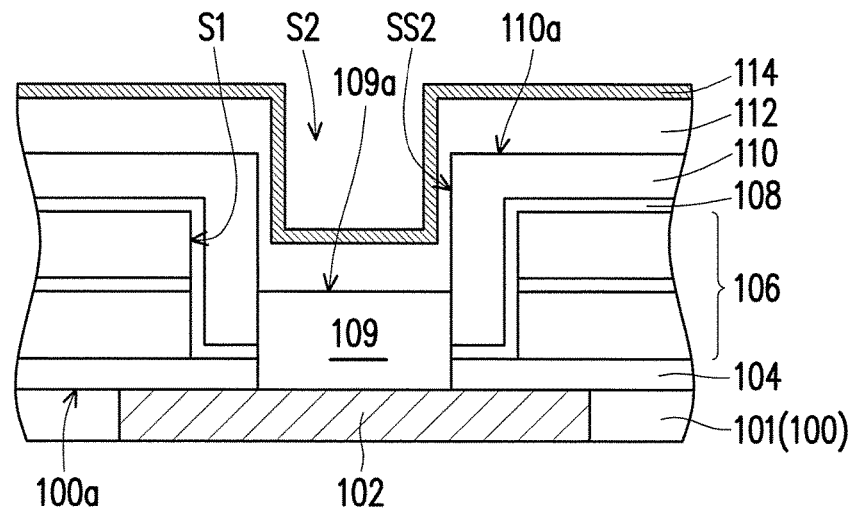

In FIG. 2B, a bonding enhancement layer 112 and a seed layer 114 are formed sequentially on the patterned filling layer 110, covering the opening S2 and on the metallic pad 109. In some embodiments, the bonding enhancement layer 112 is formed over the patterned filling layer 110 covering the top surface 110a of the patterned filling layer 110, the top surface 109a of the metallic pad 109 and partially covering the sidewalls SS2 of the opening S2. That is, the bonding enhancement layer 112 is located directly on and in direct contact with the metallic pad 109. In certain embodiments, depending on the aspect ratio, the bonding enhancement layer 112 formed on the metallic pad 109 and on the top surface 110a may be thicker than the bonding enhancement layer 112 formed on the sidewalls SS2. Later, the seed layer 114 is conformally formed on the bonding enhancement layer 112. In some embodiments, the material of the bonding enhancement layer 112 includes titanium, tungsten, chromium, a titanium-tungsten alloy, a titanium-tungsten-copper alloy, a titanium-copper alloy or combinations thereof. In one embodiment, the bonding enhancement layer 112 includes a titanium-tungsten (TiW) layer. In some embodiments, the seed layer 114 includes a gold layer formed by sputtering or PVD.

Figure 2C:
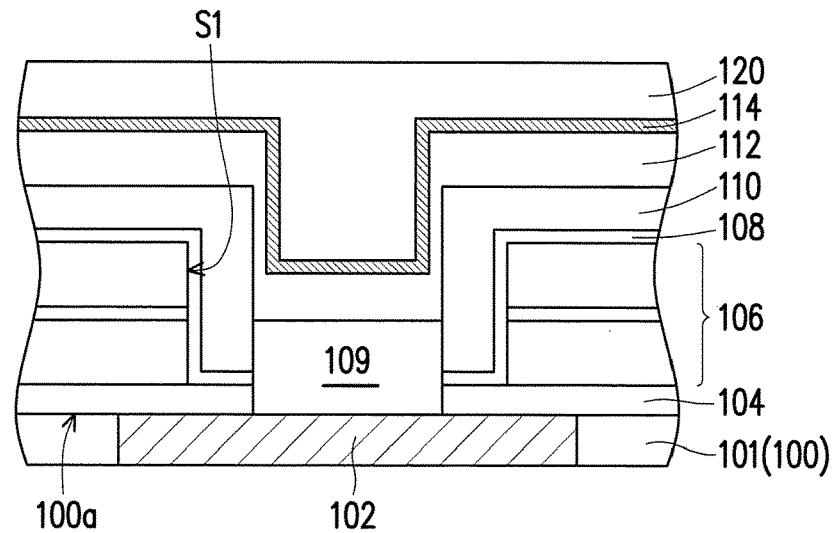

Referring to FIG. 2C, a masking layer 120 is formed over the substrate 100 and on the seed layer 114, filling up the opening S2.

Figure 2D:
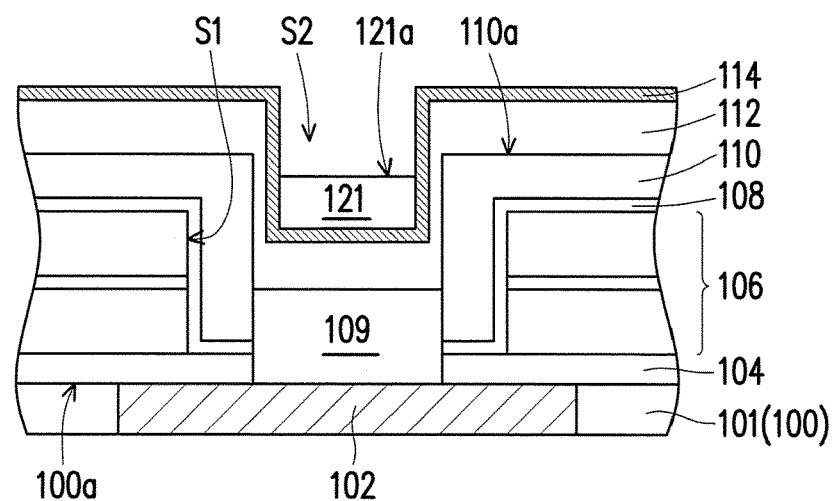

Referring to FIG. 2D, an etching back process is performed to remove the masking layer 120 outside the opening S2 and above the patterned filling layer 110 so that a masking pattern 121 is remained within the opening S2 with a top surface 121a lower than the top surface 110a of the patterned filling layer 110.

Figure 2E:
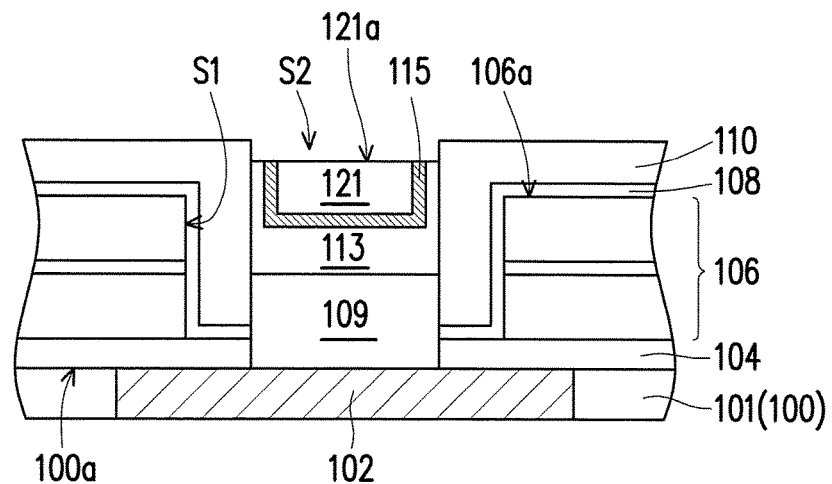

In some embodiments, in FIG. 2E, using the masking pattern 121 as an etching mask, the bonding enhancement layer 112 and the seed layer 114 outside the opening S2 and above the patterned filling layer 110 are removed to form the bonding enhancement pattern 113 and the seed pattern 115 respectively (i.e. the bonding enhancement layer 112 and the seed layer 114 remained in the opening S2 and surrounding the masking pattern 121). In certain embodiments, the tops of the bonding enhancement pattern 113 and the seed pattern 115 are leveled or slightly lower than the top surface 121a of the masking pattern 121. In one embodiment, the tops of the bonding enhancement pattern 113 and the seed pattern 115 are lower than the barrier layer 108 located on the top surface 106a of the patterned insulating layer 106. In one embodiment, the bonding enhancement layer 112 and the seed layer 114 are removed by performing at least a wet etching process.

Figure 2F:
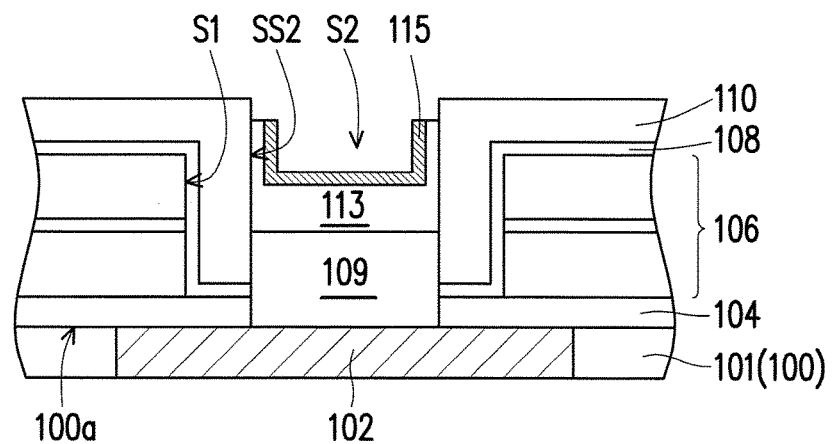

Referring to FIG. 2F, the masking pattern 121 (see FIG. 2E) is removed and the bonding enhancement pattern 113 and the seed pattern 115 located within the opening S2 are exposed.

Figure 2G:
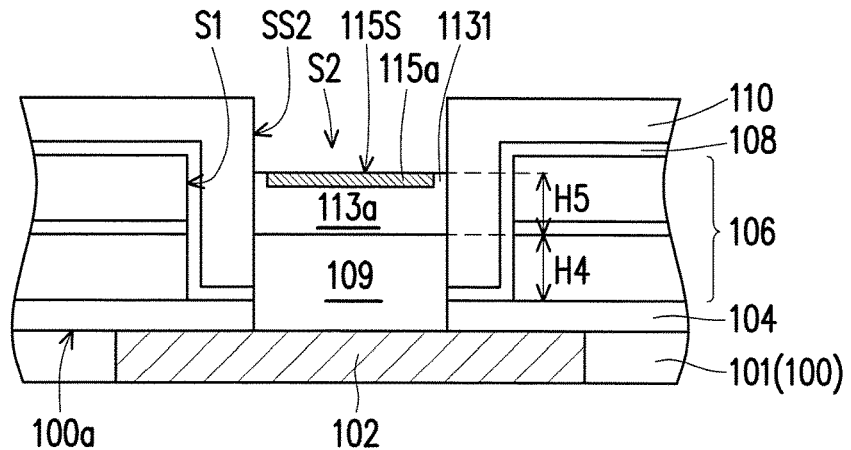

Referring to FIG. 2G, in some embodiments, the bonding enhancement pattern 113 and the seed pattern 115 located on the sidewalls SS2 are both removed. In some embodiments, the remained seed pattern 115a is surrounded by the remained bonding enhancement pattern 113a but the remained seed pattern 115a is not in contact with the sidewalls SS2. That is, the remained seed pattern 115a is surrounded by a ring-shaped ridge portion 1131 of the remained bonding enhancement pattern 113a. In some embodiments, the removal of the bonding enhancement pattern 113 and the seed pattern 115 located on the sidewalls SS2 of the opening S2 includes performing a wet etching process or a lateral etching process, which especially removes the bonding enhancement pattern 113 and the seed pattern 115 on the vertical side surfaces SS2, instead of those on the horizontal surfaces (i.e. surfaces parallel to the active surface 100a). For the bonding enhancement pattern 113 and the seed pattern 115 located on the sidewalls SS2 of the opening S2, they can be partially removed or mostly removed, depending on the etching reaction time of the etching process. In one embodiment, the top surface 115S of the remained seed pattern 115a is horizontally flush with the top surface of the ridge portion 1131. In one embodiment, the top surface 115S of the remained seed pattern 115a is lower than the barrier layer 108 located on the patterned insulating layer 106. In some embodiments, the remained bonding enhancement pattern 113a and the remained seed pattern 115a located within the opening S2 may function as an under bump metallurgy (UBM) pad 117. In some embodiments, the stack of the remained bonding enhancement pattern 113a and the remained seed pattern 115a (the UBM pad 117) has a height H5. In some embodiments, the height H5 ranges from about 500 angstroms to about 3000 angstroms.

Figure 2H:
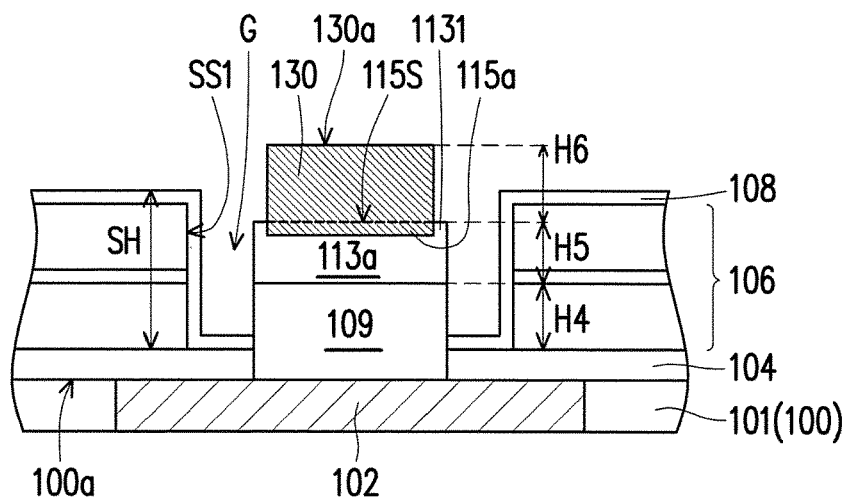
Figure 5:
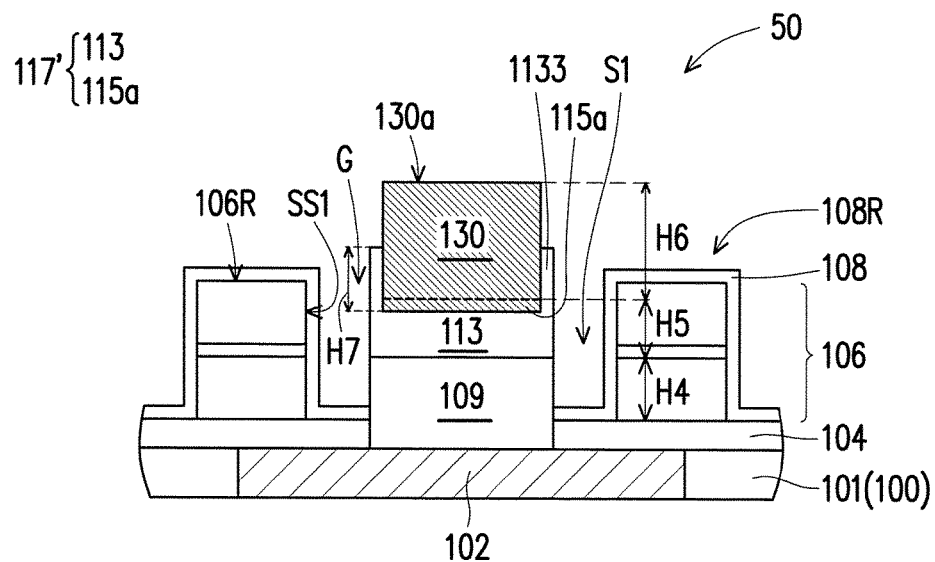
FIG. 5 is a schematic cross-sectional view of an exemplary micro-connection structure of a package in accordance with some embodiments of the present disclosure.

As shown in FIG. 2H, a plurality of bumps 130 (only one is shown) is formed within the opening S2. In some embodiments, the material of the bumps 130 includes gold formed by electroless plating. In certain embodiments, the bumps 130 are directly formed on the remained seed pattern 115a using the gold pattern as the seed layer during electroless plating. In some embodiments, the bumps 130 have a height H6. In some embodiments, the bump 130 sits on the remained seed pattern 115a with the ridge portion 1131 surrounding the bump 130. Later, the patterned filling layer 110 is removed to expose the barrier layer 108. In certain embodiments, the barrier layer 108 covers the top surface 106a and sidewalls SS1 of the patterned insulating layer 106 as well as the protection layer 104 exposed by the openings S1 of the patterned insulating layer 106. Due to the existence of the patterned insulating layer 106, the barrier layer 108 has a step height difference SH. In one embodiment, as shown in FIG. 2H, the barrier layer 108 located on the protection layer 104 is in direct contact with the metallic pad 109 but is not in contact with the bump 130 or the UBM pad 117. In some embodiments, there is a gap (empty space) G between the bump 130 and the barrier layer 108 located on the sidewalls SS1. In certain embodiments, the gap G provides room for accommodating extra bonding material during the bonding of the gold bump with external connections, thus avoiding shorts and improving the connection reliability. The bump 130 and the UBM pad 117 are isolated by the gap G and are separated from the barrier layer 108 and the patterned insulating layer 106 by the ring-shaped gap G surrounding the bump 130 and the UBM pad 117. In some embodiments, the total height (H4+H5+H6) of the metallic pad 109, the UBM pad 117 and the bump 130 is larger (higher) than the step height SH or the sum of the thickness of the protection layer 104 and the step height SH. Through the formation of the metallic pad 109, the height of the bump 130 may be smaller (compared with H2) as long as the stack of the metallic pad 109, the UBM pad 117 and the bump 130 protrudes out of the opening S1 and is higher than the barrier layer 108. In some embodiments, the total height (H4+H5+H6) of the metallic pad 109, the UBM pad 117 and the bump 130 ranges from about 0.5 microns to about 1.4 microns. In some embodiments, the gap G has a size dl (the largest distance between the bump sidewall and the barrier layer 108 located on the sidewall SS1) ranging from 0.2 microns to 1.5 microns In alternative embodiments, FIG. 5 shows an exemplary structure obtained by following the processes of FIG. 2A to FIG. 2F but going through similar process as depicted in FIG. 1H'-1J', so that the bonding enhancement pattern 113 has the sidewall portion 1133 but the seed pattern 115 is etched into the remained seed pattern 115a. As shown in FIG. 5, in certain embodiments, the micron-connection structure 50 includes the metallic pad 109, the UBM pad 117', the bump 130, the patterned insulating layer 106 and the barrier layer 108. In some embodiments, the stack of the bump 130, the UBM pad 117' and the metallic pad 109 is located on the metallic contact 102 and electrically connected with the metallic contact 102. In some embodiments, the bump 130 located on the UBM pad 117' and the metallic pad 109 protrudes out of the opening S1. In some embodiments, the bump 130 sits on the remained seed pattern 115a with the sidewall portion 1133 surrounding the bump 130. In some embodiments, the bump 130 is surrounded and partially shielded by the sidewall portion 1133 and the sidewall portion 1133 partially covers the sidewall 130S of the bump 130. In some embodiments, in FIG. 5, the patterned insulating layer 106 includes ring-shaped patterns or insulating rings 106R and the barrier layer 108 conformally covers the insulating rings 106R. In FIG. 5, the ring-shaped gap G surrounding the bump 130 isolates the bump 130 from the protruded rectangular ring 108R (the insulating rings 106R and the barrier layer 108 thereon). In FIG. 5, the barrier layer 108 is not in physical contact with the bump 130 or the UBM pad 117', but the barrier layer 108 is in contact with the metallic pad 109. In some embodiments, the total height (H4+H5+H6) of the metallic pad 109, the UBM pad 117 and the bump 130 ranges from about 0.5 microns to about 1.4 microns. In some embodiments, the height H7 of the sidewall portion 1133 is at least larger than ¹⁄₁₀ of and smaller than ½ of the total height (H4+H5+H6) of the metallic pad 109, the UBM pad 117 and the bump 130. In some embodiments, the height H4 of the metallic pad 109 is about ⅓ to ⅔ of the total height (H4+H5+H6) of the metallic pad 109, the UBM pad 117 and the bump 130.

FIG. 3A to FIG. 3F are schematic cross-sectional views showing a portion of an exemplary package at various stages of the manufacturing method for forming at least one micro-connection structure in the package according to some alternative embodiments of the present disclosure. The similar or substantially the same elements as described in FIG. 1A-FIG. 1K' may be labelled with the same reference. The technology, process details, conditions or the materials used in the similar or substantially the same manufacturing process will not be repeated or described in details in the following paragraphs.

Figure 3A:
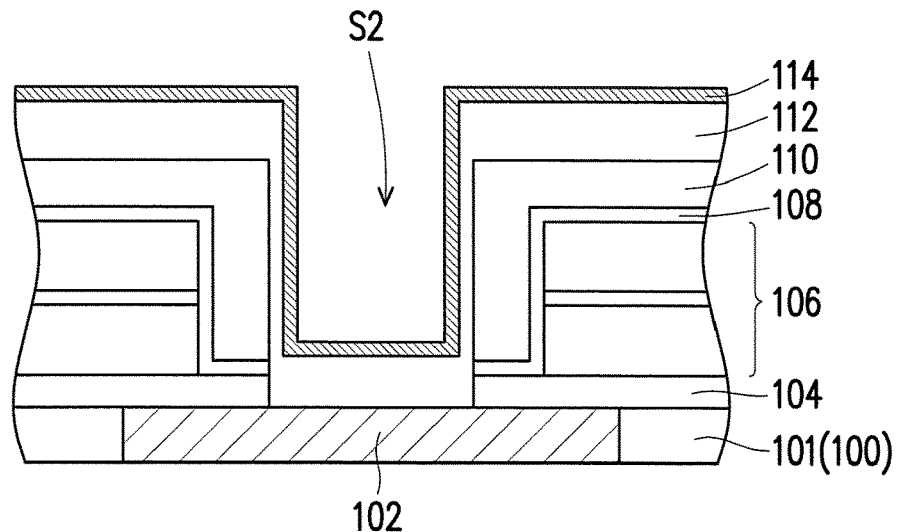
FIG. 3A to FIG. 3G are schematic cross-sectional views showing a portion of an exemplary package at various stages of the manufacturing method for forming at least one micro-connection structure in the package according to some embodiments of the present disclosure.

Referring to FIG. 3A, in certain embodiments, the substrate 100 having plural semiconductor chip or die 101 that includes more than one metallic contact 102 is provided. In some embodiments, the optional protection layer 104, the patterned insulating layer 106, the filling layer are formed as described above with openings S2 exposing the metallic contact(s) 102. In some embodiments, the bonding enhancement layer 112 and the seed layer 114 are formed sequentially on the patterned filling layer 110, covering the opening S2 and on the metallic pad 109. In some embodiments, the bonding enhancement layer 112 is formed over the patterned filling layer 110 conformally covering the opening S2. That is, the bonding enhancement layer 112 is located directly on and in direct contact with the metallic contact 102.

Figure 3B:
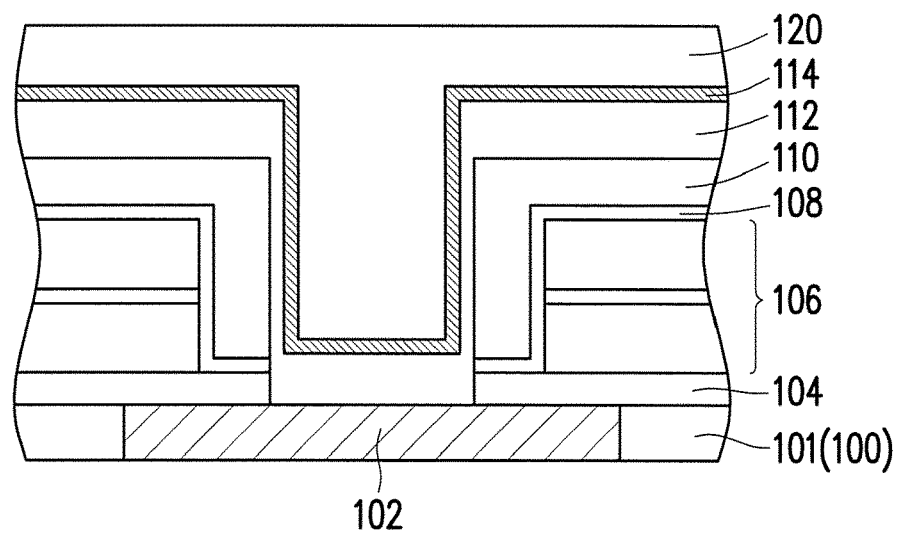

Referring to FIG. 3B, a masking layer 120 is formed over the substrate 100 and on the seed layer 114, filling up the opening S2.

Figure 3C:
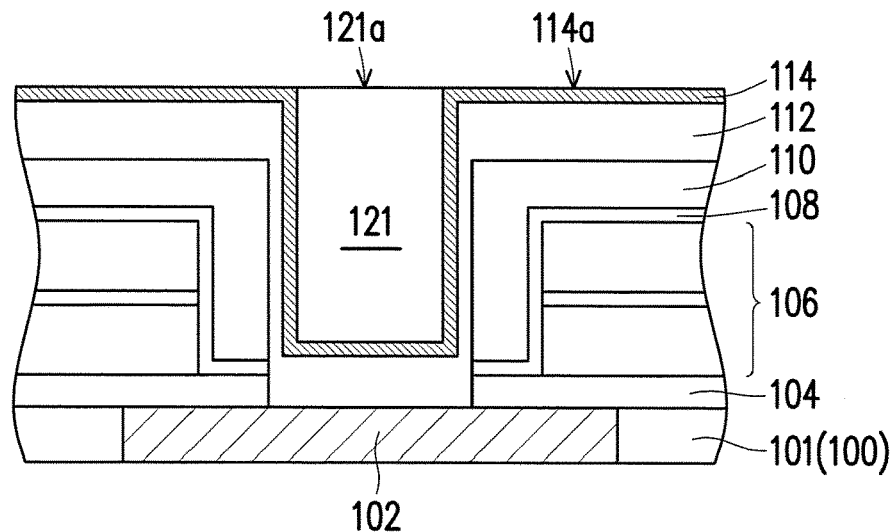

Referring to FIG. 3C, an etching back process is performed to remove the masking layer 120 outside the opening S2 and above the patterned filling layer 110 so that a masking pattern 121 is remained within the opening S2 with a top surface 121a leveled with the top surface 114a of the seed layer 114.

Figure 3D:
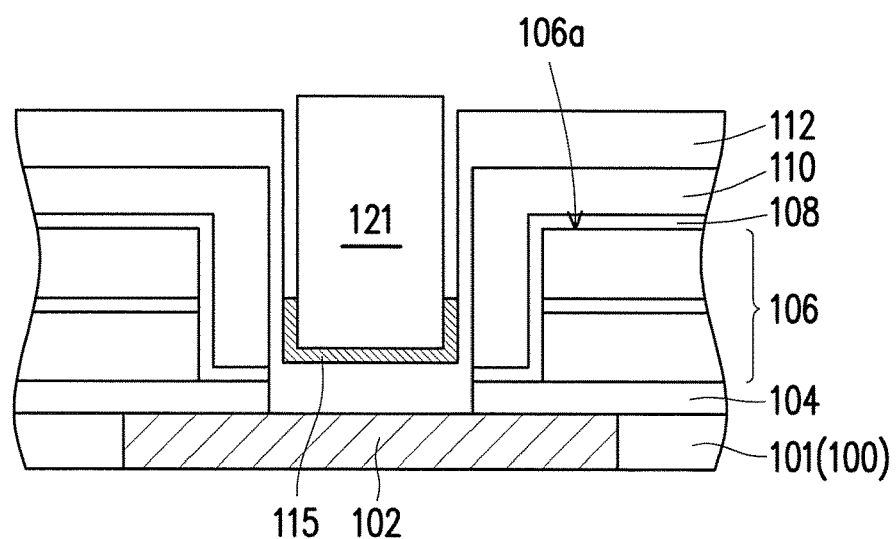

In some embodiments, in FIG. 3D, using the masking pattern 121 as an etching mask, the seed layer 114 outside the opening S2 and above the patterned filling layer 110 is removed to form the seed pattern 115 (i.e. the seed layer 114 remained in the opening S2 and surrounding the masking pattern 121). In FIG. 3D, the bonding enhancement layer 112 is not removed. In one embodiment, the top of the seed pattern 115 is lower than the barrier layer 108 located on the top surface 106a of the patterned insulating layer 106. In one embodiment, the seed layer 114 is removed by performing at least a wet etching process.

Figure 3E:
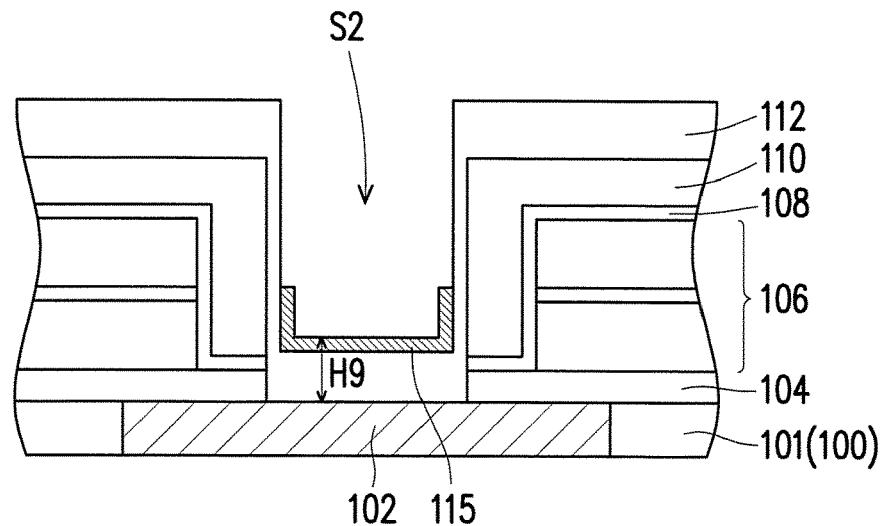

Referring to FIG. 3E, the masking pattern 121 (see FIG. 3D) is removed and the seed pattern 115 located within the opening S2 is exposed.

Figure 3F:
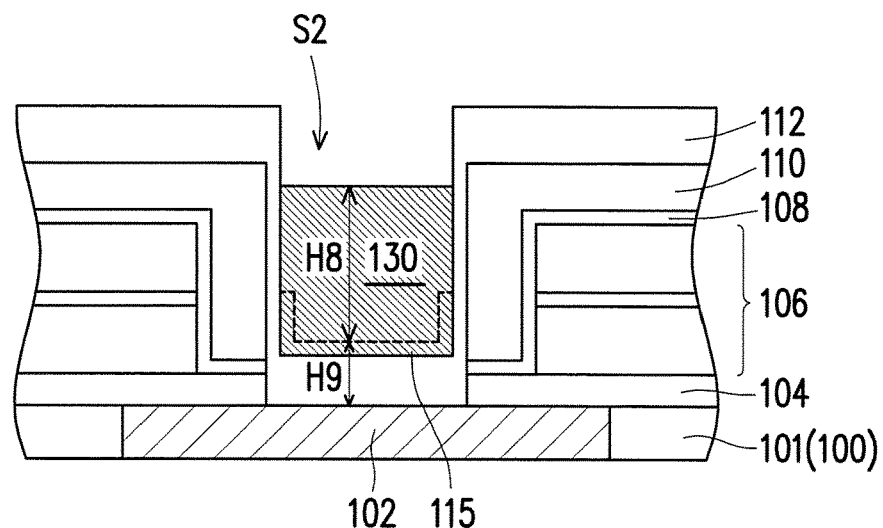

Referring to FIG. 3F, in some embodiments, a plurality of bumps 130 (only one is shown) is formed within the opening S2. In some embodiments, the material of the bumps 130 includes gold formed by electroless plating. In certain embodiments, the bumps 130 are directly formed on the seed pattern 115 using the gold pattern as the seed layer during electroless plating. In some embodiments, the bumps 130 have a height H8. In some embodiments, as the seed pattern 115 is relatively thin when compared with the bump 130 formed thereon, the seed pattern 115 may be considered as part the bump 130.

Figure 3G:
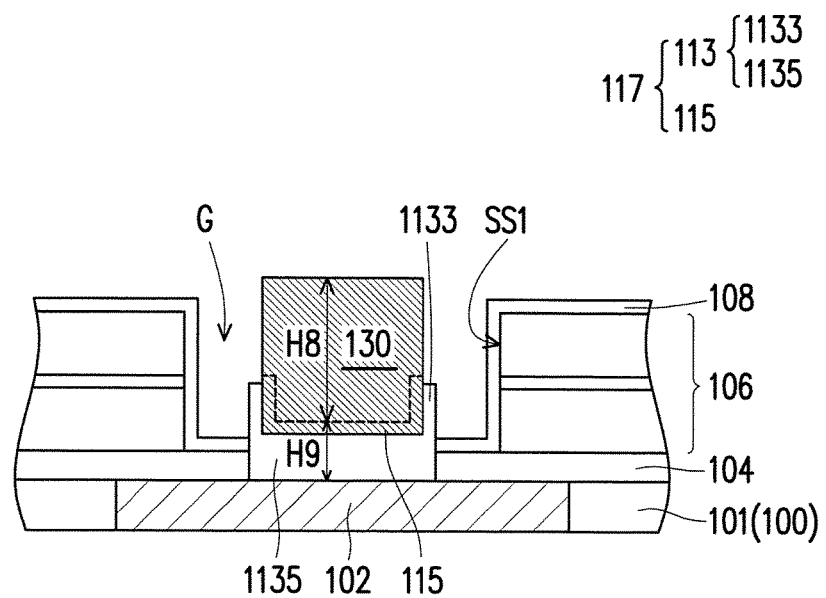

Referring to FIG. 3F and FIG. 3G, the filling layer 110 and the bonding enhancement layer 112 covering the filling layer 110 are removed. In some embodiments, the filling layer 110 is completely removed, while the bonding enhancement layer 112 is partially removed to become the bonding enhancement pattern 113. In some embodiments, the bonding enhancement pattern 113 surrounds the seed pattern 115. In some embodiments, the bonding enhancement pattern 113 has a sidewall portion 1133 covering the seed pattern 115 and a bottom portion 1135 under the seed pattern 115. That is, the remained bonding enhancement pattern 113 surrounds the seed pattern 115 and the bump 130. In one embodiment, the top of the bonding enhancement pattern 113 is lower than the barrier layer 108 on the patterned insulating layer 106. In some embodiments, the bonding enhancement pattern 113 and the remained seed pattern 115 function as an under bump metallurgy (UBM) pad 117. In some embodiments, the central portion of the UBM pad 117 (the stack of the remained bonding enhancement pattern 113 and the remained seed pattern 115) has a height H9. Due to the existence of the patterned insulating layer 106, there is a gap (empty space) G between the bump 130 and the barrier layer 108 located on the sidewalls SS1. The bump 130 is separated from the barrier layer 108 and the patterned insulating layer 106 by the ring-shaped gap G surrounding the bump 130 and the UBM pad 117. In some embodiments, the total height (H9+H8) of the UBM pad 117 and the bump 130 is larger (higher) than the total height of the stack of the barrier layer 108, the patterned insulating layer 106 and the protection layer 104. In some embodiments, the total height (H9+H8) of the UBM pad 117 and the bump 130 ranges from about 0.5 microns to about 1.4 microns. In some embodiments, the gap G has a size dl (the largest distance between the bump sidewall and the barrier layer 108 located on the sidewall SS1) ranging from 0.2 microns to 1.5 microns.

As the bonding enhancement layer 112 is not removed during the removal of the seed layer 114 and the bonding enhancement layer 112 is removed along with the filling layer 110, the bump 130 is protected from the impurities diffused from the filling layer and is able to provide a clean bonding surface, thus improving the bonding strength and the reliability of the micro-connection structure. Further, the above manufacturing processes are suitable for forming micro-connection structures in small sizes and with high density. The above-described micro-connection structures suitable for flip chip bonding contribute for higher bonding strength and better reliability and provide low inductance with lower costs for fine-pitch or high density chips.

Figure 6:
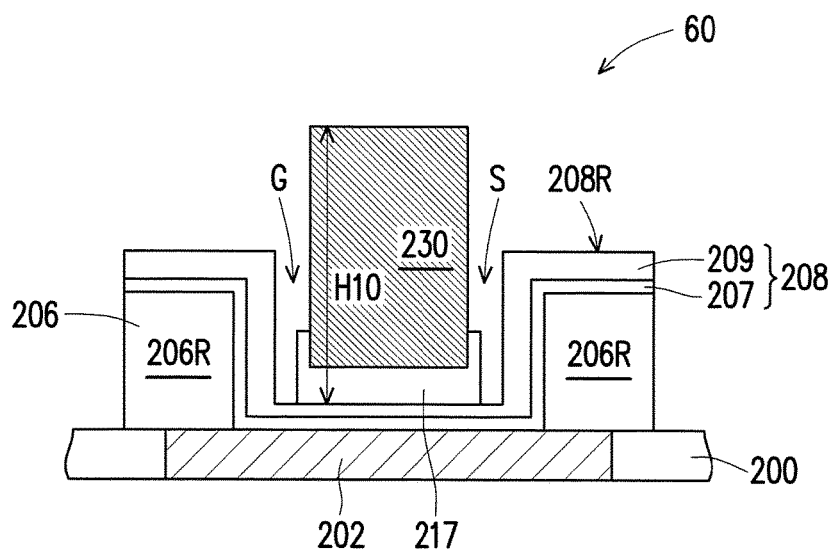
FIG. 6 is a schematic cross-sectional view of an exemplary micro-connection structure of a package in accordance with some embodiments of the present disclosure.

In alternative embodiments, FIG. 6 shows an exemplary micro-connection structure obtained following the above processes in the previous embodiments. As shown in FIG. 6, in certain embodiments, the micron-connection structure 60 at least includes the UBM pad 217, the bump 230, the insulating ring 206R and the barrier layer 208. In some embodiments, the barrier layer 208 may be formed by sputtering or depositing a tantalum layer 207 and an aluminum layer 209 sequentially over the insulating ring(s) 206R and on the metallic contact 202 and then patterned. In some embodiments, the tantalum layer has a thickness of around 50 angstroms to about 500 angstroms. In some embodiments, the aluminum layer 209 has a thickness of around 100 angstroms to 1000 angstroms. In FIG. 6, the inner sidewall and the top surface (but not covering the outer sidewall) of the insulating ring(s) 206R of the patterned insulating layer 206 are conformally covered by the barrier layer 208 and the insulating ring 206R together with the barrier layer 208 thereon constitute a protruded ring structure 208R. In some embodiments, the stack of the bump 230 and the UBM pad 217 is located on the metallic contact 202 and electrically connected with the metallic contact 202 of the substrate 200. In FIG. 6, the ring-shaped gap G surrounding the bump 230 isolates the bump 230 from the protruded rectangular ring 208R. In FIG. 6, the barrier layer 208 is not in physical contact with the bump 230 but the UBM pad 217 is located directly on the barrier layer 208 above the metallic contact 202. In some embodiments, the bump 230 located on the UBM pad 217 is higher than the protruded ring structure 208R and protrudes out of the opening S. In some embodiments, the total height H10 of the UBM pad 217 and the bump 230 may be equivalent to or less than 2 microns or may range from about 0.5 microns to about 1.4 microns. If considering the bump 230 being a round bump, the diameter (size) of the bump 230 may be equivalent to or less than 3 microns or may range from about 1.5 microns to about 2.8 microns.

In some embodiments, some of the above described manufacturing processes may be part of wafer-level packaging processes or are compatible with the wafer-level packaging processes. In certain embodiments, the manufacturing processes of the micro-connection structures may include wafer-level bumping process or gold bumping process, involving forming gold bumps on the wafer or reconstructed wafer structure. In certain embodiments, the micro-connection structures may be applied as inter-connections for microprocessors, radio frequency ICs, image sensors, light emitting diodes (LED), liquid crystal display (LCD), organic light emitting diode (OLED) display or other flat-panel display.

Figure 7:
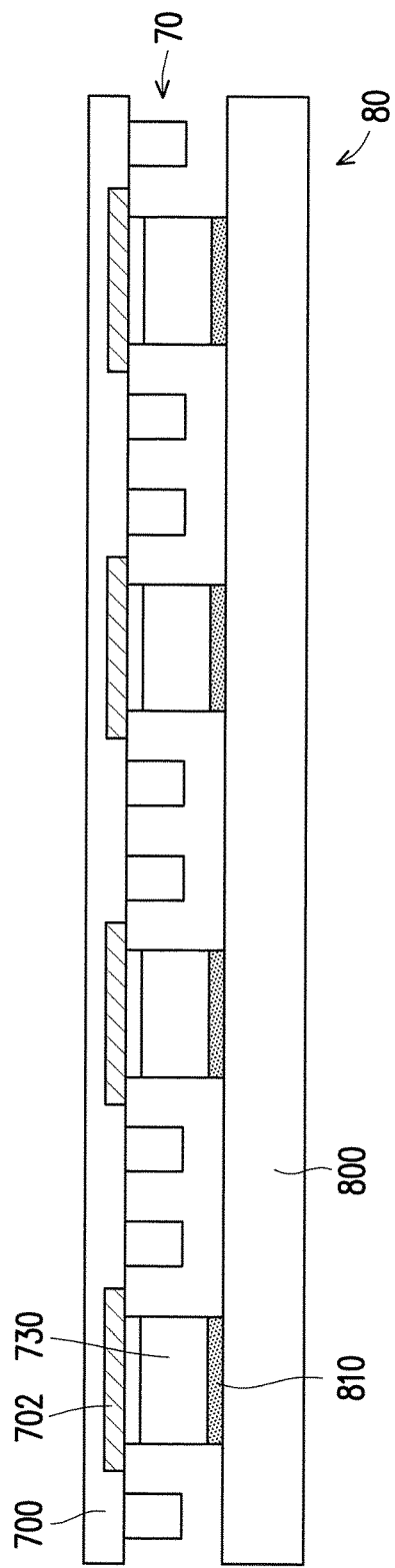
FIG. 7 is a schematic cross-sectional view of an exemplary package having micro-connection structures in accordance with some embodiments of the present disclosure.

FIG. 7 is a schematic cross-sectional view of an exemplary package having micro-connection structures in accordance with some embodiments of the present disclosure. Referring to FIG. 7, a plurality of micro-connection structures 70 is provided between metallic contacts 702 of a first substrate 700 and the contacts 810 of a second substrate 800. In some embodiments, the micro-connection structures 70 include one or more types of micro-connection structures as described in the above embodiments. The substrate 700 is electrically connected with the substrate 800 through the micro-connection structures 70. In one embodiment, the first substrate 700 is a semiconductor chip, such as a driver IC and the bump 730 is a gold bump or gold stud bump. In one embodiment, the second substrate 800 is a glass substrate for a LCD display and the contacts 810 are indium tin oxide (ITO) electrodes.

In some embodiments of the present disclosure, a micro-connection structure is provided. The micro-connection structure includes an under bump metallurgy (UBM) pad, a bump and an insulating ring. The UBM pad is electrically connected to at least one metallic contact of a substrate. The bump is disposed on the UBM pad and electrically connected with the UBM pad. The insulating ring surrounds the bump and the UBM pad. The bump is separate from the insulating ring with a distance and the bump is isolated by a gap between the insulating ring and the bump.

In some embodiments of the present disclosure, a method for forming a micro-connection structure is provided. The method includes at least the following steps. After providing a substrate having metallic contacts, an insulating pattern is formed over the substrate. A barrier layer is deposited to cover the insulating pattern and over the substrate. A filling layer is formed on the barrier layer and over the insulating pattern. The filling layer and the barrier layer are patterned to form openings. The openings expose the metallic contacts. A bonding enhancement layer and a seed layer are sequentially formed on the patterned filling layer and on the exposed metallic contacts. A masking pattern is formed within the openings. The bonding enhancement layer and the seed layer outside the openings and on the patterned filling layer are removed. After removing the masking pattern, the seed layer located on sidewalls of the openings is removed to form seed patterns in the openings. Bumps are formed on the seed patterns in the openings. The patterned filling layer is removed.

In some embodiments of the present disclosure, a method for forming a micro-connection structure is provided. The method includes at least the following steps. A substrate having metallic contacts is provided. An insulating layer with first openings is formed over the substrate. A barrier layer covering the first openings and the insulating layer is deposited. A filling layer is deposited on the barrier layer and over the insulating layer. Second openings exposing the metallic contacts are formed. A bonding enhancement layer and a seed layer are sequentially formed covering the second openings and on the exposed metallic contacts. After filling a masking pattern in the second openings, the seed layer is removed to form seed patterns in the second openings using the masking pattern as an etching mask. The masking pattern is then removed. Bumps are formed on the seed patterns in the openings, and the bonding enhancement layer and the filling layer are then removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-connection structure, comprising:
   an under bump metallurgy (UBM) pad, electrically connected to at least one metallic contact of a substrate;
   a bump, disposed on the UBM pad and electrically connected with the UBM pad;
   an insulating ring surrounding the bump and the UBM pad; and
   a barrier layer, disposed on and covering the insulating ring,
   wherein the bump is separate and isolated from the barrier layer and the insulating ring by an open trench between the barrier layer on a sidewall of the insulating ring and the bump.

2. The structure of claim 1, wherein the barrier layer is in contact with the UBM pad without being in contact with the bump.

3. The structure of claim 1, wherein the UBM pad is located directly on the barrier layer and the barrier layer is not in contact with the bump located on the UBM pad.

4. The structure of claim 3, wherein the barrier layer comprises a tantalum layer conformally covering the insulating ring and an aluminum layer located on the tantalum layer.

5. The structure of claim 1, further comprising a metallic pad disposed directly under the UBM pad and sandwiched between the UBM pad and the at least one metallic contact, wherein the UBM pad is electrically connected to the at least one metallic contact through the metallic pad.

6. The structure of claim 5, wherein the UBM pad includes a sidewall portion surrounding the bump and covering a sidewall of the bump, and a height of the sidewall portion is larger than about tenth of a total height of the metallic pad, the UBM pad and the bump and is less than about half of the total height of the metallic pad, the UBM pad and the bump.

7. The structure of claim 5, wherein a height of the metallic pad is about one third to two third of a total height of the metallic pad, the UBM pad and the bump.

8. The structure of claim 5, wherein the barrier layer is in contact with the metallic pad without being in contact with the UBM pad and the bump.

9. The structure of claim 1, wherein the UBM pad includes a sidewall portion surrounding the bump and covering a sidewall of the bump, and a height of the sidewall portion is larger than about tenth of a total height of the UBM pad and the bump and is less than about half of the total height of the UBM pad and the bump.

10. A method for forming a micro-connection structure, comprising:
    providing a substrate having metallic contacts;
    forming an insulating pattern over the substrate;
    depositing a barrier layer covering the insulating pattern and over the substrate;
    forming a filling layer on the barrier layer and over the insulating pattern;
    patterning the filling layer and the barrier layer to form openings, where the openings expose the metallic contacts;
    forming a bonding enhancement layer and a seed layer sequentially on the patterned filling layer and on the exposed metallic contacts;
    forming a masking pattern within the openings;
    removing the bonding enhancement layer and the seed layer outside the openings and on the patterned filling layer;
    removing the masking pattern;
    removing the seed layer located on sidewalls of the openings to form seed patterns in the openings;
    forming bumps on the seed patterns in the openings; and
    removing the patterned filling layer.

11. The method of claim 10, wherein removing the bonding enhancement layer and the seed layer outside the openings and on the patterned filling layer comprises performing a wet etching process.

12. The method of claim 11, wherein forming a bonding enhancement layer and a seed layer comprises forming a titanium-tungsten layer and then forming a gold layer by sputtering.

13. The method of claim 10, further comprising forming metallic pads on the exposed metallic contacts before forming a bonding enhancement layer and a seed layer.

14. The method of claim 13, wherein forming metallic pads comprise forming copper pads by electroless plating.

15. The method of claim 10, further comprising removing the bonding enhancement layer located on the sidewalls of the openings to form bonding enhancement patterns in the openings after removing the masking pattern.

16. The method of claim 10, wherein forming bumps comprises forming gold bumps by electroless plating.

17. A method for forming a micro-connection structure, comprising:
    providing a substrate having metallic contacts;

forming an insulating layer with first openings over the substrate;

depositing a barrier layer covering the first openings and the insulating layer;

depositing a filling layer on the barrier layer and over the insulating layer;

forming second openings exposing the metallic contacts;

forming a bonding enhancement layer and a seed layer sequentially covering the second openings and on the exposed metallic contacts;

filling a masking pattern in the second openings;

removing the seed layer to form seed patterns in the second openings using the masking pattern as an etching mask;

removing the masking pattern;

forming bumps on the seed patterns in the openings; and removing the bonding enhancement layer and the filling layer.

18. The method of claim 17, wherein the bonding enhancement layer is not removed during removing the seed layer to form seed patterns.

19. The method of claim 17, wherein removing the seed layer comprises performing a wet etching process to remove the seed layer above the masking pattern.

20. The method of claim 17, wherein forming a bonding enhancement layer and a seed layer comprises forming a titanium-tungsten layer and then forming a gold layer by sputtering, and forming bumps comprises forming gold bumps by electroless plating.

* * * * *